(12) United States Patent
Rumsby

(10) Patent No.: US 10,008,403 B2
(45) Date of Patent: Jun. 26, 2018

(54) APPARATUS FOR PROCESSING CONTINUOUS LENGTHS OF FLEXIBLE FOIL

(75) Inventor: Philip Thomas Rumsby, Oxon (GB)

(73) Assignee: M-SOLV LIMITED, Oxford (GB)

( * ) Notice: Subject to any disclaimer, the term of this patent is extended or adjusted under 35 U.S.C. 154(b) by 1065 days.

(21) Appl. No.: 13/502,975

(22) PCT Filed: Oct. 19, 2009

(86) PCT No.: PCT/GB2009/002476
§ 371 (c)(1),
(2), (4) Date: Jun. 4, 2012

(87) PCT Pub. No.: WO2011/048345
PCT Pub. Date: Apr. 28, 2011

(65) Prior Publication Data
US 2012/0241419 A1    Sep. 27, 2012

(51) Int. Cl.
*B23K 26/06* (2014.01)
*B23K 26/08* (2014.01)
*B23K 26/10* (2006.01)
*B23K 26/00* (2014.01)
*B29C 35/08* (2006.01)
*H01L 21/677* (2006.01)
(Continued)

(52) U.S. Cl.
CPC .... *H01L 21/67739* (2013.01); *B23K 26/0084* (2013.01); *B23K 26/082* (2015.10); *B23K 26/0846* (2013.01); *H01L 31/18* (2013.01)

(58) Field of Classification Search
CPC ........... B23K 26/0084; B23K 26/0807; B23K 26/0846; B23K 26/0087; B23K 26/0823; B23K 26/0869; B23K 26/359; B23K 26/06; B23K 26/08; B23K 26/10; B23K 26/00; H01L 21/67739; H01L 31/18; H01L 21/67748; B29C 35/08
USPC ... 219/121.6, 121.67, 121.72, 121.8, 121.82; 425/145; 264/400
See application file for complete search history.

(56) References Cited

U.S. PATENT DOCUMENTS

| 4,115,683 A | 9/1978 | Clark et al. |
| 5,576,754 A | 11/1996 | Korem |

(Continued)

FOREIGN PATENT DOCUMENTS

| DE | 40 23 530 A1 | 1/1992 |
| EP | 0530634 A2 | 3/1993 |

(Continued)

OTHER PUBLICATIONS

Japanese to English machine translation of JP 2000235267.*

(Continued)

*Primary Examiner* — Michael Hoang
(74) *Attorney, Agent, or Firm* — Harness, Dickey & Pierce, P.L.C.

(57) ABSTRACT

An apparatus and method are described that use a cylindrical drum type vacuum drum and allows accurately registered, high resolution laser patterning of thin films on discrete lengths or flexible substrate material that are unwound from an unwind reel and after processing are rewound onto a rewind reel. Length compensator units are provided either side of the drum to accommodate variations in the length of the substrate due to differential rotation of the drum and the unwind and rewind reels.

4 Claims, 3 Drawing Sheets

(51) Int. Cl.
*B23K 26/082* (2014.01)
*H01L 31/18* (2006.01)

(56) References Cited

U.S. PATENT DOCUMENTS

| | | |
|---|---|---|
| 2002/0166470 A1 | 11/2002 | Nedblake et al. |
| 2008/0011225 A1 | 1/2008 | McClure et al. |
| 2008/0031640 A1* | 2/2008 | Fukui .................. G03F 7/70791 |
| | | 399/9 |

FOREIGN PATENT DOCUMENTS

| | | |
|---|---|---|
| EP | 1 449 798 A2 | 8/2004 |
| GB | 1474505 A | 5/1977 |
| GB | 2310829 A | 9/1997 |
| GB | 2 458 986 A | 10/2009 |
| GB | 2 459 154 A | 10/2009 |
| JP | 08 117279 A | 5/1996 |
| JP | 2000235267 A * | 8/2000 |
| JP | 2009 138239 A | 6/2009 |
| WO | WO-2008/015550 A2 | 2/2008 |

OTHER PUBLICATIONS

Written Opinion of the International Searching Authority regarding Application No. PCT/GB2009/002476, dated Apr. 13, 2010.

* cited by examiner

APPARATUS FOR PROCESSING CONTINUOUS LENGTHS OF FLEXIBLE FOIL

CROSS-REFERENCE TO RELATED APPLICATIONS

This application is a 371 U.S. National Stage of International Application No. PCT/GB2009/002476, filed on Oct. 19, 2009, the disclosure of which is herein incorporated by reference in its entirety.

TECHNICAL FIELD

This invention relates to apparatus for processing long, continuous lengths of flexible foil substrate to form high resolution, two-dimensional patterns thereon with a high level of positional accuracy. In particular it relates to the processing of the substrate on a cylindrical drum. The apparatus is particularly appropriate for the formation of electrical interconnects between the multilayer thin films found in flexible photovoltaic panels and other microelectronic devices and for the patterning or repair of flexible displays.

BACKGROUND ART

Laser micro-processing requires that the substrate to be processed is accurately located at the focus or image plane of an optical system. For flat sheet substrates, a flat vacuum chuck is usually used to hold the material flat and to retain it laterally to maintain registration of the part during process motion. In this case, a variety of different methods are used to achieve the required relative motion between the laser and the substrate. For small sheets, a stationary laser beam with the chuck and substrate moved in two axes is preferred for ease of laser beam delivery. For large sheets, to minimize footprint, it is common to move the laser head in two axes over a stationary substrate. This arrangement is considerably more complex in terms of beam delivery so a crossed axis approach, where the laser head moves in one axis and the substrate in the other, is also often used as a sensible compromise. In all cases a flat vacuum chuck is appropriate for retaining the substrate during processing.

Laser processing on cylindrical drum shaped substrates is very common especially in the printing industry for the production of gravure or flexographic plates. In this case, the relative motion between the substrate and the laser beam is achieved by rotary motion of the drum about its axis and linear motion of the drum or laser head in a direction parallel to the drum axis. The material to be laser processed is bonded to the drum surface so registration during processing is not an issue.

In the cases discussed above, the maximum substrate area is limited to the surface area of the flat chuck or drum. Hence, these methods are unsuitable to deal with the recent requirement from the flexible electronics industry to carry out laser process operations on devices supported on continuous webs of flexible substrate material. In this case, it is usual for the substrate material to be processed in long lengths or "webs" in so called "reel to reel" form with discrete areas of the substrate arranged along the web requiring laser patterning.

When finite lengths of substrate forming part of a continuous web of flexible material need to be laser processed, because of the limitations caused by the associated unwind and rewind drums, it is no longer possible to clamp a length of the substrate to a flat chuck and move it in two orthogonal axes. Hence, it is usual to operate in a mode where a length of the substrate is clamped to a stationary flat vacuum chuck and the laser process head is moved in two axes over the full process area by means of a motorized double gantry system. As discussed above, such an arrangement is not ideal for ease of laser beam delivery to the moving laser head.

In an associated application (GB 0806307.5), an apparatus for laser processing discrete lengths of a continuous flexible substrate is described. This apparatus uses the crossed axis approach with a flat vacuum chuck that moves in the web flow direction and a laser head that moves across the web width on a gantry. The vacuum chuck is required to move over the full length of the process area in the web flow direction so the surplus web material released at each end as the chuck moves from one end of its travel to the other is accommodated in web accumulator devices.

The length of the apparatus supporting the moving chuck is at least twice as long as the substrate process length in order to allow for movement of the flat chuck over its full length. Hence, if long sections of the web are to be processed in a single registration step, the apparatus length can become considerable. This is often inconvenient, and costly, especially if the apparatus is to be installed in a clean room, and consequently there is a requirement for apparatus that occupies less floor area yet is able to create high resolution, accurately registered, laser patterns in or on discrete lengths of flexible web materials which are unwound from reels and rewound onto reels.

DISCLOSURE OF INVENTION

According to a first aspect of the invention, there is provided apparatus for processing long, continuous lengths of a flexible foil substrate in discrete defined lengths in order to form high resolution, two-dimensional patterns with a high level of positional accuracy on the substrate, said apparatus comprising:

a. a cylindrical drum, rotatably mounted about an axis parallel to a first direction, being porous or having an array of holes over one or more areas of the surface of the drum so that a vacuum can be applied via said porous areas or holes to retain a defined length of the flexible substrate on part of the drum surface;

b. a motor system for rotating the drum in one or both directions about said axis;

c. a laser process unit mounted adjacent the drum for processing the length of substrate retained on the surface of the drum;

d. a mechanism for accurately moving the laser process unit in said first direction over the surface of the substrate;

e. a first reeler unit situated on one side of the drum for periodically dispensing a defined length of unprocessed flexible substrate from a first reel in a second direction that is perpendicular to the first direction to the drum for processing thereon;

f. a first substrate length compensator unit located between the first reel and the drum for accommodating variations in length of substrate due to differential movement of the first reel and the drum;

g. a second reeler unit situated on the other side of the drum for periodically rewinding a defined length of the flexible substrate onto a second reel in the second direction after processing;

h. a second substrate length compensator unit located between the drum and the second reel for accommodating variations in the length of substrate due to differential movement of the drum and second reel; and i. a control system arranged to control
  i. periodic application of a vacuum to the drum surface to retain a defined length of substrate on part of the drum surface;
  ii. operation of the laser process unit;
  iii. movement of the laser process unit along the length of the drum in the first direction;
  iv. rotation of the drum over part of a full revolution in one or both directions); and
  v. periodic release of the vacuum from the drum surface and operation of the first and second reels to rewind a length of substrate containing a processed area and unwind a further defined length of unprocessed substrate from the first reel.

Apparatus according to the invention, preferably comprises the following components:— a. a web unwind unit, with associated web brake and tension control systems, that has the ability to clamp the web substrate or periodically dispense a defined discrete length of unprocessed flexible web substrate from a cylindrical reel for laser processing;

b. a web length compensation unit that is able to accommodate all length changes and maintain constant tension in the discrete length of dispensed unprocessed substrate such that the degree of web elongation is defined;

c. a roller unit to change the direction of flow of the web and guide the web on to the surface of a process drum;

d. a cylindrical shaped vacuum process drum mounted on an axle which is driven by a servo motor that causes the drum to rotate to move the surface of the drum in the direction parallel to the web flow direction;

e. arrays of vacuum channels, vacuum holes or areas of porous material arranged in azimuthal zones in part or all of the outer surface of the drum for attaching a defined length of the unprocessed substrate to part of the surface of the drum during processing;

f. a laser process unit mounted beside, over or under the drum and attached to a servo motor driven stage that causes it to move in a direction parallel to the drum axis across the width of the web;

g. one or more camera units attached to the laser process unit that are able to view the substrate top surface;

h. a second roller unit to change the direction of flow of the web and guide the web from the surface of the process drum;

i. a second web length compensation unit that is able to accommodate all length changes and maintain constant tension in the discrete length of processed substrate such that the degree of web elongation is defined;

j. a web rewind unit and associated web brake and tension control systems that has the ability to clamp the web substrate or periodically take up a defined length of the flexible substrate and wind it onto a cylindrical reel after processing;

k. control systems that allows programmed, co-ordinated motion of the process unit and the chuck and operation of the web length compensators and the unwind and rewind units.

According to a second aspect of the invention there is provided a method of processing long, continuous lengths of a flexible foil substrate in discrete defined lengths to form high resolution, two-dimensional patterns with a high level of positional accuracy on the substrate, the method comprising the following steps:

a. providing a cylindrical drum, rotatably mounted about an axis parallel to a first direction, the drum being porous or having an array of holes over one or more areas of the surface of the drum so that a vacuum can be applied via said porous areas or holes to retain a defined length of the flexible substrate on part of the drum surface;

b. rotating the drum in one or both directions about said axis;

c. mounted a laser process unit adjacent the drum for processing the length of substrate retained on the surface of the drum;

d. moving the laser process unit in said first direction over the surface of the substrate;

e. providing a first reeler unit on one side of the drum to periodically dispense a defined length of unprocessed flexible substrate from a first reel in a second direction that is perpendicular to the first direction to the drum for processing thereon;

f. providing a first substrate length compensator unit between the first reel and the drum to accommodate variations in length of substrate due to differential movement of the first reel and the drum;

g. providing a second reeler unit on the other side of the drum to periodically rewind a defined length of the flexible substrate onto a second reel in the second direction after processing;

h. providing a second substrate length compensator unit between the drum and the second reel to accommodate variations in the length of substrate due to differential movement of the drum and second reel; and i. providing a control system to control:—
  i. periodic application of a vacuum to the drum surface to retain a defined length of substrate on part of the drum surface;
  ii. operation of the laser process unit;
  iii. movement of the laser process unit along the length of the drum in the first direction;
  iv. rotation of the drum over part of a full revolution in one or both directions); and
  v. periodic release of the vacuum from the drum surface and operation of the first and second reels to rewind a length of substrate containing a processed area and unwind a further defined length of unprocessed substrate from the first reel.

The apparatus is thus operated as follows:— a) the brakes on the unwind and rewind units are both released and both units operate so that a discrete length of the web substrate is advanced under tension control so that a defined length of unprocessed substrate material is moved to be in, contact with the outer surface of the drum;

b) vacuum is applied via channels, holes or pores to selected azimuthal areas in the drum surface so that a defined length of substrate material is firmly clamped to that part of the drum surface;

c) the unwind and rewind reels are both stopped and the brakes applied;

d) both web length compensators are activated to take up and release the excess web material that arises at each side of the drum due to the movement of its surface in the web direction caused by rotation of the drum;

e) the servo motor rotates the drum to a defined rotational position and the laser process unit is moved on its stage on another defined position so the camera unit attached to the laser process unit is able to locate the position of fiducial marks or other pattern references on the area of substrate vacuum clamped to the drum;

f) the exact positions of the reference marks with respect to reference locations are measured;

g) corrections are made in the drum and stage control software to compensate for any measured angular or positional offsets of the substrate from a standard position;

h) the substrate on the drum is processed by appropriate rotation of the process drum and linear movement of the laser process unit;

i) the vacuum is released from the surface of the drum supporting the area of processed substrate;

j) the unwind and rewind unit brakes are released and both are operated under tension control so the processed length of the substrate is pulled through the apparatus and moved from the drum process area;

k) steps a to j above are repeated.

The apparatus described thus provides a novel form of cylindrical rotating vacuum chuck for retaining and moving part of a continuous length of a flexible non-woven substrate so that the substrate or thin films on the substrate can be laser processed. The substrate is part of a continuous web of material and is unwound from a drum and processed in discrete lengths and after processing is rewound onto another drum. The cylindrical vacuum chuck retains the substrate surface at the focal plane of the laser process head so that fine scale, accurately registered, patterns can be created in or on the substrate.

The web foil material used with this apparatus can be made of any flexible material suitable for supporting microelectronic or sensor devices. It is envisaged that in general the material will be a polymer such as polyester or polycarbonate but foils of metal or paper can also be used. Foil thicknesses are generally envisaged to be in the few tens of microns to few hundreds of micron range but thicker foils are possible if they are required and are able to be processed from reels and thinner foils are also possible. Web widths are envisaged to be in the range of a few hundred mm to over 1 m with lengths up to several km if required but narrower, wider and longer webs can also be used with the apparatus described.

The unwind and rewind reel units operate only when the substrate web material is released from the drum surface and are used to advance defined lengths of substrate for processing. While the substrate on the drum is being processed, the unwind and rewind units are held stationary under closed loop tension control and the web brakes applied. The reels on both units are driven by servo motors and have feedback from web tension sensors in order to maintain an appropriate tension in the web to control the elongation. It is envisaged that typical web advance distances, corresponding to discrete process area lengths will be in the range a few hundred mm up to one meter but other shorter and longer advance and process distances are also possible. An important feature is that the apparatus is very flexible and that the lengths of the processed substrate and the lengths of the separating unprocessed substrate areas can be changed by suitable programming of the motion of the unwind and rewind units. If these units unwind and rewind the same length of web each time they operate, then the process length remains the same. If they are caused to rewind a different length to that unwound, then the process length can be varied.

The architecture of the apparatus is of the so called crossed axis type with the process head moving in one axis across the width of the web and the defined length of substrate to be laser processed clamped to the drum surface moving in an orthogonal direction parallel to the web flow direction. Coverage of the full area of the substrate to be processed is carried out in one of the following modes:— a) step and scan mode where the laser process unit and process drum both move intermittently, b) raster scan mode across the web where the laser process unit makes a series of continuous moves across the full web width and the drum makes a series of rotational step moves, that move the substrate attached to the surface over distances that are less than the full process length, whenever the laser process unit has completed a pass across the web, c) raster scan mode along the web where the drum makes a series of continuous rotational moves that move the substrate attached to the surface over distances equal to the full process length and the laser process unit makes a series of step moves, that are less than the full web width, whenever the drum has completed a full pass and d) vector write mode where both laser process unit and drum move at the same time in a coordinated manner.

A key aspect of this invention is that all or part of the surface of the process drum is covered in arrays of holes or channels or alternatively with areas of porous ceramic or metal material and that these features are attached to a suitable vacuum pump to apply vacuum to the drum surface in order to clamp a length of the flexible substrate to the surface to hold it rigidly in place during laser processing. The vacuum holes or pores in the drum surface are arranged and interconnected so that vacuum can be applied selectively to different azimuthal areas of the drum surface. The length of substrate, in the web flow direction, that is clamped to the drum surface can thus be varied by applying vacuum to different numbers of adjacent azimuthal zones.

Key points related to the substrate and drum of the apparatus described are as follows:— a) the area of the substrate that is vacuum clamped to the drum surface is the maximum area that is available to be laser processed by the laser process unit;

b) areas less than the full vacuum clamped area can be laser processed but no substrate areas outside the clamped area can be processed since these are not registered accurately to the drum surface and may move during laser processing;

c) the substrate material that is vacuum clamped to the drum surface remains in contact with the drum surface at all times during laser processing to avoid stressing the substrate by separating it from the vacuum clamped region.

d) the positions of guide rollers before and after the drum dictate the length of the substrate that is in contact with the drum surface. If the guide rollers have a small diameter and are placed close to each other and the drum surface then the length of substrate in contact with the drum surface can be close to the full circumference of the drum. For guide rollers that are more separated and further from the drum surface the length of substrate in contact with the drum surface reduces. In practical situations the expectation is that the length of substrate in contact with the drum will lie in the range one half to three quarters of the drum circumference.

e) the length of the region of substrate vacuum clamped to the drum surface must be equal to or less than half the length of the substrate in contact with the drum surface so that when the drum rotates in either direction by an amount such that vacuum clamped length passes fully under the laser process unit the substrate in the vacuum clamped region never leaves the drum surface. In this way the full length of the vacuum clamped region of the substrate is laser processed and at no time does the processed area lift from the drum surface and lose position registration. In practical situations the expectation is that the length of the vacuum clamped substrate and hence the maximum length of substrate that is process able will lie in the range one quarter to three-eights of the drum circumference.

When the apparatus is operating in any of the four laser process unit and drum combined motion modes discussed above and because the substrate is attached to the rotating drum there is a requirement to handle excess substrate material on each side of the drum and guide roller assembly. This is done by means of the two special high speed web length compensator units. One unit is situated between the drum assembly and the unwind unit and the other unit is situated between the drum assembly and the rewind unit. The function of these two units is to take up and release excess substrate material as the drum is rotated over some or all of its full travel in the web direction without impeding the accuracy and speed of rotation, without imparting sufficient drag to the web to cause the length of substrate vacuum clamped to the drum to move with respect to the drum surface and without damaging the substrate or any unprocessed or processed film on the substrate. The length compensator units are required to perform most intensively when the apparatus is operating in raster scan mode along the web where the drum makes a series of continuous rotational moves of up to one half of a revolution. In this case, the length compensator units may be required to repeatedly take up and release slack web material at speeds up to several metres per second. In practice the length compensator units will most likely consist of an arrangement of closely spaced parallel rollers where one moveable roller is situated between two fixed rollers such that when the moveable roller is displaced with respect to the fixed rollers some length of web is taken up or dispensed. If the rollers are spaced such that the web lengths on each side of the moveable roller are parallel then the length of web released or taken up is equal to twice the travel distance of the roller. Either passive or active movement of the roller is possible. In the passive case, the roller relies on gravity to maintain web tension. In the active case, the roller is driven up or down by a mechanism that incorporates a web tension sensor. Other arrangements for web length compensator units with are possible. Units with one or multiple moving rollers mounted either horizontally or vertically can be used to suit the particular requirement.

A variety of different optical patterning heads can be attached to the laser process unit. These include:—
1. an optical system for directly focussing a pulsed laser beam onto the web surface for ablation of the substrate or thin films on the substrate or for exposure of thin films on the substrate;
2. an optical system using a laser beam for imaging a mask pattern onto the web surface for ablation of the substrate or thin films on the substrate or for exposure of thin films on the substrate;
3. a scanner and f-theta lens system for focussing a pulsed laser beam onto the web surface for ablation of the substrate or thin films on the substrate or for exposure of thin films on the substrate
4. a scanner and f-theta lens system using a laser beam for imaging an aperture onto the web surface for ablation of the substrate or thin films on the substrate or for exposure of thin films on the substrate.

Multiple laser patterning heads of the same type or different types can be attached to the laser process unit.

The laser process heads can be used to pattern the thin film on the substrate surface in several different modes using either synchronous, continuous motions of both the process unit and the drum or by a series of continuous motions of one of either the process head or the drum in either direction combined with a series of intermittent motions of the other in either direction or by a series of intermittent motions by both the drum and the process head. If the laser process unit contains one or more focussing type laser beam delivery heads the full area of the defined length of web is processed by either synchronous, continuous motions of both the laser head and the drum or by a series of continuous motions of one of either the laser head or the drum in either direction combined with a series of intermittent motions of the other in either direction. If the process unit contains one or more laser beam delivery heads consisting of 2D scanner and lens units the full process area of the substrate can be patterned by the laser units in step and scan mode with a series of intermittent motions of both the process unit and the drum in either direction. An alternative arrangement with 2D scanner and lens units is possible. In this case, the full area of the defined process length of substrate is patterned in bands in raster mode by a series of continuous motions of one of either the scanner and lens unit or the drum in either direction combined with a series of intermittent motions of the other in either direction.

When using scanner and lens units to process the substrate, consideration has to be given to the curvature of the drum surface and its impact on how well the laser beam is focussed or imaged onto the drum surface. For situations where the scanner units only deflect the beam in a direction parallel to the drum axis, as would occur when raster mode processing in the web direction is being performed, then curvature of the substrate surface on the drum has little impact on the accuracy of focussing or imaging of the beam. However, when step and scan mode or across the web width raster mode processing is being performed, the drum curvature can cause a problem in terms of maintaining beam focus especially for drums with small diameter or for scanner and lens units with large optical field. In these cases, compensation for substrate curvature may be necessary. Use of an optical telescope, with dynamically controlled component spacing, placed before the scanner and lens unit to change the distance of the beam focus from the lens is one way to overcome this problem.

Accurate registration of any new applied pattern to any existing pattern on the substrate is one of the most important aspects of the apparatus described since many of the microelectronic device manufacturing operations for which this apparatus is suitable require the accurate superposition of a pattern in one layer of material on top of one or more underlying patterned layers. This is achieved in practice by performing a pre-process alignment procedure using one or more camera units attached to the laser process unit. The cameras view the substrate surface on the drum after vacuum clamping and are fitted with suitable optics and illumination sources for observation of existing patterns or fiducial marks on the substrate. By programmed motion of the servo motors driving the laser process head stage or the rotation of the drum, any point on the area of the substrate vacuum clamped to the drum can be accessed by the camera units for fiducial or reference mark position identification. At each alignment mark location, the exact position of the mark in a camera field of view is recorded and the offset of the mark from a reference position calculated. After the exact locations of two or more marks on each discrete substrate area have been identified, the angular and spatial displacements of the area of web on the drum to be processed can be calculated and corrections introduced into the program that controls the motions of the laser process unit and drum rotation.

Since the web is flexible and will be subject to multiple handling and processing operations, it is possible that the area of the substrate to be processed may become distorted. The length and width may both change by small amounts and the area may even become non-linearly distorted. These substrate distortion effects may all be compensated for by using the alignment camera or cameras to locate the exact position of a sufficient number of alignment marks on the substrate area to allow calculation of the exact shape followed by corrections to the motion of the laser process unit and the drum in order to match the new pattern exactly to the existing distorted pattern.

An important part of the proposed apparatus is the control system that allows programmed, co-ordinated motion of the laser process unit and the drum and also operation of the web length compensators and the unwind and rewind units. The system also needs to be able to capture data from the alignment cameras, identify the fiducial mark offsets, calculate the shape and location of the existing pattern on the substrate and make corrections to the program controlling the drum rotation and laser process head servo motors so that the new pattern exactly overlays the existing one. The control system also needs to control the triggering of the pulses from the laser or lasers used for film ablation and the operation of the deflection mirrors in the beam scanner unit or units.

Other preferred and optional features of the invention will be apparent from the following description and the subsidiary claims of the specification.

BRIEF DESCRIPTION OF DRAWINGS

The invention will now be further described, merely by way of example, with reference to the accompanying drawings of which.

DETAILED DESCRIPTION OF DRAWINGS

FIG. 1

Figure 1:
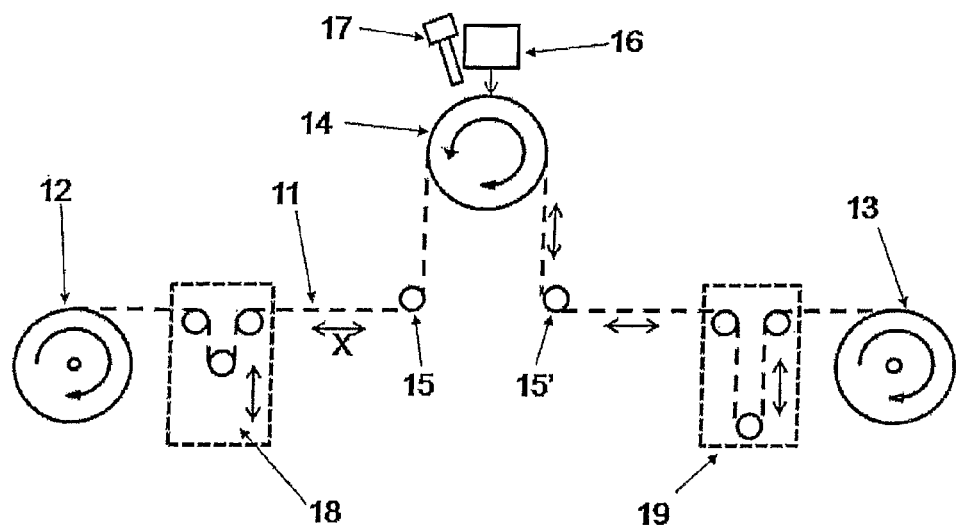
FIG. 1 shows a schematic side view of apparatus according to an embodiment of the invention.

FIG. 1 shows a side view of the apparatus showing a continuous web of flexible material 11 that is periodically unwound from an unwind reel 12 on one side of the apparatus and periodically rewound onto a rewind reel 13 on the other side of the apparatus. In the figure, the unwind unit and rewind unit are both shown to rotate clockwise so that the web is periodically advanced from left to right. Both units are driven by servo motors and have feedback from web tension sensors, which are not shown, in order to maintain an appropriate tension in the web at all times. The apparatus has a cylindrical vacuum process drum 14 which rotates about an axis parallel to the axes of the unwind and rewind reels. The drum axle is attached to a servo motor so that the drum can rotate in an accurately controlled manner in either direction over a part of a revolution or by one or more complete revolutions. Two guide rollers 15, 15' are used to direct the web to and from the drum and position the web with respect to the drum so that the substrate is in contact with the drum surface over a substantial part of the drum circumference. In the figure, the two guide rollers are positioned such that the substrate contacts the drum over approximately half of its circumference. The process drum has arrays of holes or porous areas over all or part of its surface so that vacuum can be applied to clamp a length of the substrate to part of the drum surface. The vacuum can be applied selectively to different azimuthal regions of the drum surface so that only a portion of the substrate in contact with the drum surface is clamped. The apparatus has a laser process unit 16 that is attached to a carriage on a servo motor driven stage on a gantry over the drum. The direction of travel of the stage carrying the laser process unit is along the drum length in a direction parallel to the axes of rotation of the drum and the unwind and rewind reels. The laser process unit has a camera unit 17 attached to it for observation of existing patterns or fiducial marks on the substrate. By programmed motion of the servo motor rotating the drum and the servo motor driving the stage carrying the laser process unit, any point on the area of the substrate vacuum clamped to the drum can be accessed for processing by the laser process unit or for fiducial mark position identification by the camera. A first web length compensator unit 18 is situated between the unwind reel and the process drum and guide roller assembly to take up and release any slack in unprocessed substrate material in the X direction arising during laser processing due to the rotation of the process drum and attached substrate (while the unwind reel is stationery). A second web length compensator unit 19 is situated between the drum and guide roller assembly and the rewind unit to take up and release any slack processed substrate material in the X direction arising due to the rotation of the drum and attached substrate (while the rewind reel is stationery). In operation, the unwind and rewind units operate to allow a defined length of substrate to be moved through the apparatus. Vacuum is applied to an area of the drum surface to clamp the defined length of substrate that is to be processed. The laser process unit then moves across the web by moving along the drum length and the drum performs rotational moves over part of a full rotation to process the full area. During laser processing the full area of the substrate that is to be processed always remains vacuum clamped to the drum and the first and second web length compensator units accommodate variations in the length of web on each side of the drum due to differential movements of the drum relative to the unwind and rewind reels, respectively

FIG. 2

Figure 2:
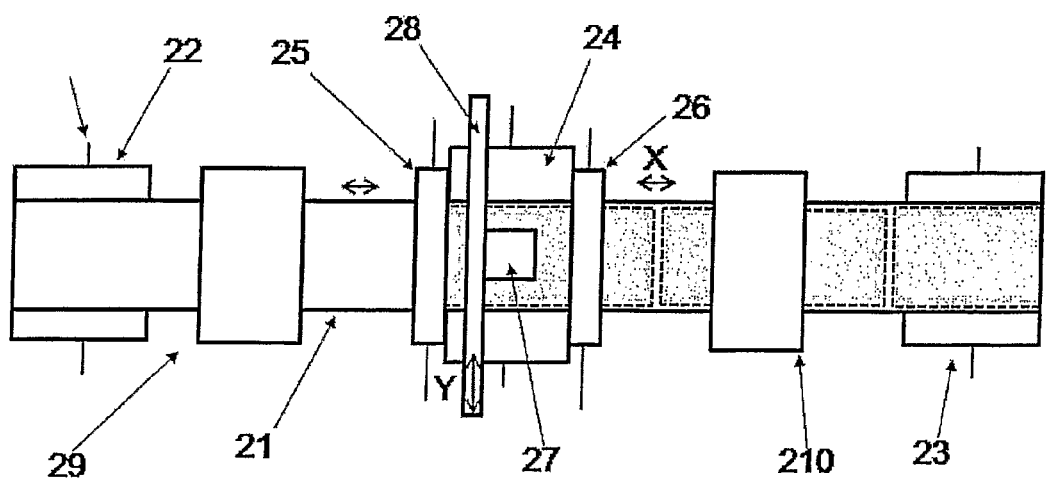
FIG. 2 shows a schematic top view of the apparatus shown in FIG. 1.

FIG. 2 shows a top view of the proposed apparatus showing a continuous web of flexible material 21 that is unwound on one side of the apparatus from an unwind reel 22 which rotates on an axle 23 which is parallel to a first direction. The web passes through the apparatus in a second direction which is perpendicular to the first direction and is eventually taken up onto a rewind reel 23 on the opposite side of the apparatus. The substrate passes around the process drum 24 which is able to rotate about an axis parallel to the first direction. A pair of guide rollers 25, 26 with axes parallel to the first direction, cause the web to change direction such that the substrate is in contact with a significant fraction of the drum circumference. A defined length of part of the web substrate that is in contact with the drum surface is vacuum clamped for laser processing. A laser process unit 27 is attached to a carriage on a stage on a gantry 28 over the web. The stage is servo motor controlled and causes the laser process unit to move across the full width of the web in the Y direction. By coordinated motions of the drum and the stage, the full area of the defined length of substrate clamped to the process drum is accessible to the laser process unit and can be laser processed. After laser processing is complete, the vacuum on the drum is released and the web is advanced by a control unit that causes the unwind and rewind units to activate. Web length compensator units 29, 210 before and after the process drum take up the slack web material on each side of the drum as the drum makes partial revolutions during laser processing.

FIG. 3

Figure 3:
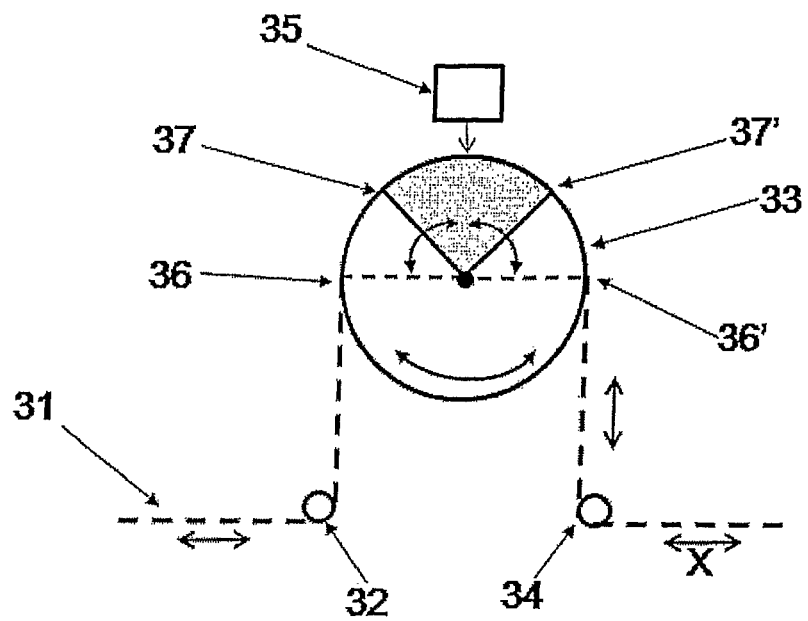
FIG. 3 shows an enlarged side view of a drum and guide rollers of the apparatus shown in FIG. 1.

FIG. 3 shows an enlarged side view of the drum region of the apparatus. Continuous substrate material 31 is dispensed from an unwind reel via a length compensator unit (not shown) on the left of the figure. Guide roller 32 directs the substrate film towards a vacuum process drum 33. After the substrate has passed around the process drum it is redirected by a second guide roller 34 to pass to a length compensator unit and rewind unit (not shown) on the right of the figure. Part of the surface area of the process drum is covered with arrays of holes or porous material so that vacuum can be applied to clamp the, substrate to a part of the drum surface. The vacuum can be applied selectively to different azimuthal regions of the drum surface so that only a portion of the substrate in contact with the drum surface is clamped. The apparatus has a laser process unit 35 that is attached to a carriage on a servo motor driven stage on a gantry over the drum. The direction of travel of the stage carrying the laser process head is along the length of the drum, parallel to the axes of rotation of the drum and the unwind and rewind reels. The figure shows the case where the guide rollers each side of the drum are situated in such a position that the substrate contacts the drum surface from position 36 to position 36' which is approximately half the total drum circumference. Vacuum holes or pores cover all or part of the drum surface but in the figure only the region between positions 37 and 37' is activated so clamping the substrate between these points securely to the drum surface. This clamped region is the area that is laser processed. The length of the clamped region of substrate must be equal to or less than half the length of the substrate contacting the drum surface so that, when the drum rotates clockwise or anti-clockwise, the end of the vacuum clamped region never leaves the drum surface. In the figure, one end of the clamped substrate moves from position 37 as far as but no further than position 36 as the drum rotates anti-clockwise by about 45 degrees and the other end moves from position 37' as far as but no further than position 36' as the drum rotates clockwise by about 45 degrees. In this way, the full length of the vacuum clamped region of the substrate is laser processed and at no time does any part of the processed area lift from the drum surface and loose position registration. In the arrangement shown in the figure, the maximum length of substrate that can be vacuum clamped to the drum surface and can be laser processed is approximately equal to one quarter of the drum circumference. In this case, if there is a requirement to laser process the web in, for example, 600 mm lengths separated by 20 mm wide unprocessed bands, the minimum diameter of drum that can be used is about 790 mm.

FIG. 4

Figure 4:
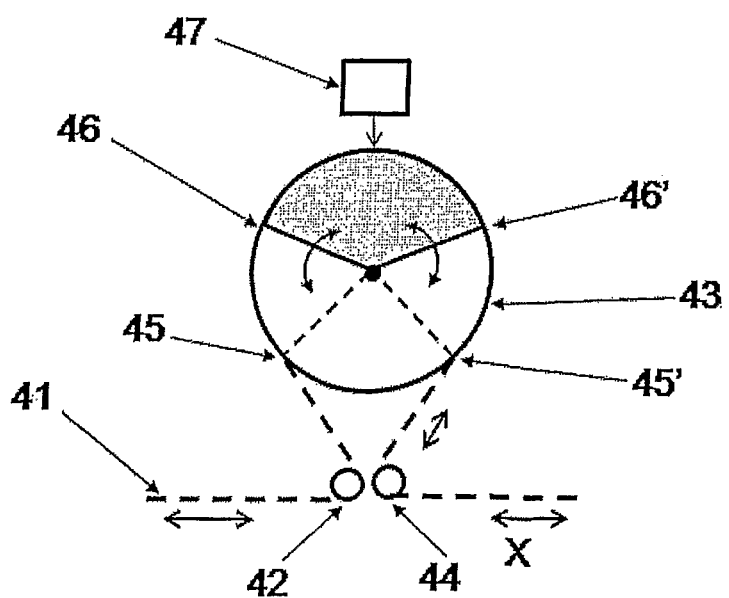
FIG. 4 shows a side view of an alternative version of the drum and guide rollers.

FIG. 4 shows an enlarged side view of a variation of the drum region of the apparatus where the length of the substrate in contact with the drum surface is arranged to be a larger fraction of the full drum circumference than that shown in FIG. 3. Continuous substrate material 41 is dispensed from an unwind reel via a length compensator unit (not shown) on the left of the figure. Guide roller 42 directs the substrate film towards the surface of the vacuum process drum 43. After the substrate has passed around the process drum, it is redirected by second guide roller 44 to pass to a length compensator unit and rewind unit (not shown) on the right of the figure. The figure shows the case where the guide rollers each side of the drum are situated in such a place that the substrate contacts the drum surface from position 45 to position 45' which is approximately three quarters of the total drum circumference. Vacuum holes or pores cover all or part of the drum surface but in the figure only the region between positions 46 and 46' is activated so clamping the substrate between these points securely to the drum surface. This clamped region is the area that is laser processed by laser processed unit 47. The length of the clamped region of substrate must be equal to or less than half the length of the substrate contacting the drum surface so that, when the drum rotates either clockwise or anti-clockwise, the ends of the vacuum clamped region never leave the drum surface. In the figure, one end of the clamped substrate moves from position 46 as far as but no further than position 45 as the drum rotates by about 62.5 degrees anti-clockwise and the other end moves from position 46' as far as but no further than position 45' as the drum rotates by about 62.5 degrees clockwise. In this way, the full length of the vacuum clamped region of the substrate is laser processed and at no time does the processed area lift from the drum surface and loose position registration. In the arrangement shown in the figure, the maximum length of substrate that can be vacuum clamped to the drum surface and can be laser processed is approximately equal to three eighths of the drum circumference. In this case, if there is a requirement to laser process the web in, for example, 600 mm lengths separated by 20 mm wide unprocessed bands, the minimum diameter of drum that can be used is about 525 mm.

FIG. 5

Figure 5:
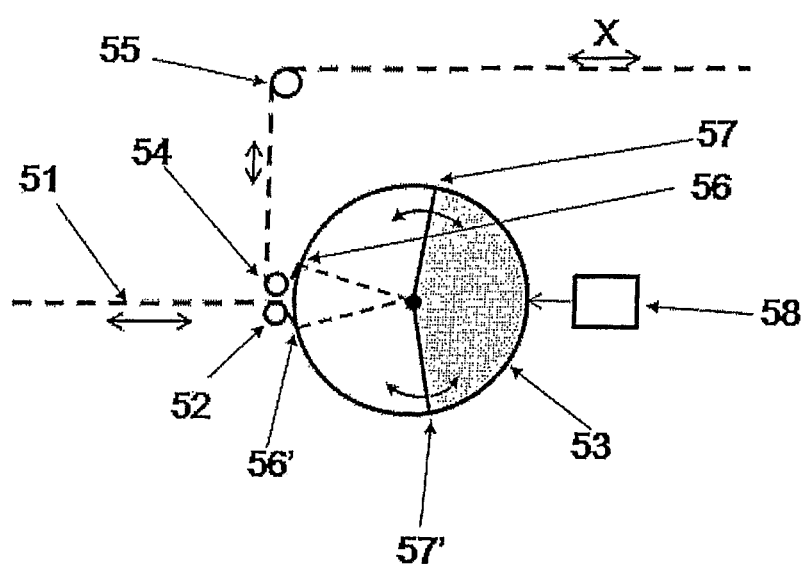
FIG. 5 shows a further alternative arrangement of the drum and guide rollers.

FIG. 5 shows a side view of a variation of the drum and roller region of the apparatus where the centre of the length of substrate that is in contact with the drum, and hence the centre of the laser process region, is situated on the side of the drum rather than on top of the drum as shown in previous figures. In addition, the size and position of the guide rollers have been arranged to maximize the length of substrate in contact with the drum. An unwind reel and a length compensator unit (not shown) dispense continuous substrate material 51 from the left of the figure. A first guide roller 52 directs the substrate film downwards towards the surface of the vacuum process drum 53. After the substrate has passed around the process drum, it is redirected by guide roller 54 and additional roller 55 to pass to a length compensator unit and rewind unit (not shown) on the right of the figure. The figure shows the case where the guide rollers each side of the drum are situated in such a place that the substrate contacts the drum surface from position 56 to position 56' which is approximately 90% of the total drum circumference. Vacuum holes or pores cover all or part of the drum surface but in the figure only the region between positions 57 and 57' is activated so clamping the substrate between these points securely to the drum surface. This clamped region is the area that is laser processed by laser processed unit 58. The length of the clamped region of substrate must be equal to or less than half the length of the substrate contacting the drum surface so that when the drum rotates in a clockwise or anti-clockwise direction the ends of the vacuum clamped region never leave the drum surface. In the figure, one end of the clamped substrate moves from position 57 as far as but no further than position 56 as the drum rotates about 85 degrees anti-clockwise and the other end moves from position 57' as far as but no further than position 56' as the drum rotates about 85 degrees clockwise. In this way, the full length of the vacuum clamped region of the substrate is laser processed but at no time does the processed area lift from the drum surface and loose position registration. In the arrangement shown in the figure the maximum length of substrate that can be vacuum clamped to the drum surface and can be laser processed is half the length of the substrate in contact with the drum surface and is approximately equal to 45% of the drum circumference. In this case, if there is a requirement to laser process the web in, for example, 600 mm lengths separated by 20 mm wide unprocessed bands, the minimum diameter of drum that can be used is about 440 mm.

Many other drum, guide roller and laser process unit arrangements other than those shown in the figures are possible depending on the particular requirements. In the figures, the laser process unit is shown to be placed either vertically above or horizontally beside the drum but other positions such as below the drum or at some oblique angle to the vertical or horizontal are also possible. Other rollers can be placed at various positions before or after the drum and guide roller assembly to direct the web in any convenient direction.

The arrangements described thus provide apparatus for laser processing long, continuous lengths of a flexible foil substrate in discrete defined lengths in order to create high resolution, 2D patterns with a high level of positional accuracy in the substrate material or in thin films on the substrate, said apparatus comprising;

a. a cylindrical drum, that rotates about an axis parallel to a first direction, that has arrays of holes or areas of pores covering part or all of the surface of the drum so that a vacuum can be applied to selected areas of the drum surface in order to clamp down a discrete, defined length of the flexible substrate and retain it in position on part of the drum surface during laser processing;

b. a servo motor system for rotating the drum either continuously, or by one or more revolutions or by a part of a revolution in either direction;

c. a laser process unit mounted over, under or beside the drum;

d. a mechanism for accurately moving the laser process unit in the first direction over part or the full length of the drum the motion being in either direction in continuous or intermittent reciprocating motion during laser processing;

e. a first reeler unit situated on one side of the drum for periodically dispensing a defined discrete length of the unprocessed flexible substrate from a reel in a second direction that is perpendicular to the first direction for laser processing while maintaining constant tension in the substrate in the second direction;

f. a first substrate length compensator unit situated between the first reel and the drum for accommodating all substrate length changes in the second direction and maintaining constant tension in the second direction in the length of dispensed unprocessed substrate as the length varies due to the end nearer the reel being held stationary and the other end nearer the process drum being caused to move during laser processing;

g. a second substrate length compensator unit situated on the other side of the drum for accommodating all length changes and maintaining constant tension in the second direction in the length of processed substrate as the length varies due to one end being held stationary and the other end being caused to move during laser processing;

h. a second reeler unit for periodically rewinding a defined discrete length of the flexible substrate onto a cylindrical drum in the second direction after processing while maintaining constant tension in the substrate in the second direction;

i. a control system that:—
  i. periodically applies vacuum to a part of the area of the drum surface in order to clamp a defined length of substrate to part of the drum surface while keeping the unwind and rewind drums stationary;
  ii. allows the laser process unit to be accurately positioned at any point along the length of the drum in the first direction;
  iii. rotates the chuck over part of a full revolution and moves the laser process unit over all or part of the drum length by means of either synchronous, continuous motion of both the process unit and the drum or by a series of continuous motions of one of either the process unit or the drum in either direction combined with a series of intermittent motions of the other in either direction;
  iv. operates the laser process unit;
  v. periodically releases the vacuum from the drum surface under the processed length of substrate and simultaneously operates the unwind and rewind drum units in order to rewind a length of substrate containing the full length of the processed area and unwind a defined discrete length of unprocessed substrate, the defined length of unprocessed substrate being unwound being the same or different to that being rewound

The invention claimed is:

1. A method of processing long, continuous lengths of a flexible foil substrate in discrete defined lengths to form high resolution, two-dimensional patterns with a high level of positional accuracy on the substrate, the method comprising the following steps:

a. rotating a cylindrical drum in one or both rotational directions about an axis that is parallel to a first direction, the drum having an area that is porous or has an array of holes extending through the drum from an interior of the drum to an outer surface of the drum, so that a vacuum applied to the interior of the drum acts on the outer surface of the drum to retain a defined length of the flexible substrate on a part of the outer surface of the drum;

b. rotating the drum about said axis;

c. mounting a laser process unit adjacent the drum for processing the length of substrate retained on the outer surface of the drum;

d. moving the laser process unit in said first direction over the substrate retained on the outer surface of the drum;

e. periodically dispensing a defined length of unprocessed flexible substrate from a first reel of a first reeler unit to the drum for processing thereon, the first reeler unit being on one side of the drum to dispense the unprocessed flexible substrate from the first reel in a second direction that is perpendicular to the first direction;

f. operating a first substrate length compensator unit disposed between the first reel and the drum to accommodate variations in length of substrate due to differential movement of the first reel and the drum;
g. periodically rewinding a defined length of the flexible substrate onto a second reel of a second reeler unit after processing, the second reeler unit being on the other side of the drum from the first reeler unit to rewind the defined length of the flexible substrate onto the second reel in the second direction;
h. operating a second substrate length compensator unit disposed between the drum and the second reel to accommodate variations in length of substrate due to differential movement of the drum and the second reel;
i. periodically applying and releasing the vacuum to the interior of the drum to retain a defined length of substrate on the part of the outer surface of the drum, the vacuum being applied to the interior of the drum within an azimuthal zone and not applied to the interior of the drum outside of the azimuthal zone; and
j. selectively rotating the azimuthal zone about the axis while applying the vacuum within the azimuthal zone and not outside the azimuthal zone.

2. The method of claim 1, further comprising the step of selectively rotating the azimuthal zone relative to the drum about the axis.

3. The method of claim 1, further comprising the step of selectively rotating the azimuthal zone at a rotational rate that is equal to a rotational rate of the drum.

4. The method of claim 1, further comprising selectively increasing and decreasing an angular range of the azimuthal zone between a first angular range and a second angular range that is different from the first angular range.

\* \* \* \* \*